United States Patent
Maitra et al.

(10) Patent No.: US 12,313,660 B2
(45) Date of Patent: May 27, 2025

(54) METHODS AND APPARATUS TO IMPROVE ACCURACY OF CURRENT SENSE CIRCUITRY

(71) Applicant: Texas Instruments Incorporated, Dallas, TX (US)

(72) Inventors: Richeek Maitra, Bangalore (IN); Ganapathi Shankar, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 255 days.

(21) Appl. No.: 18/190,963

(22) Filed: Mar. 27, 2023

(65) Prior Publication Data
US 2024/0329101 A1    Oct. 3, 2024

(51) Int. Cl.
*G01R 19/165* (2006.01)
*G01R 19/32* (2006.01)

(52) U.S. Cl.
CPC . *G01R 19/16519* (2013.01); *G01R 19/16571* (2013.01); *G01R 19/32* (2013.01)

(58) Field of Classification Search
CPC .............. G01R 19/0092; G01R 19/165; G01R 19/16519; G01R 19/16566; G01R 19/16571; G01R 19/1659; G01R 19/32; G05F 3/245; G05F 3/26; G05F 3/262; G05F 1/463; G05F 1/567
See application file for complete search history.

(56) References Cited

U.S. PATENT DOCUMENTS

| | | | | |
|---|---|---|---|---|
| 5,815,027 A | * | 9/1998 | Tihanyi | G01R 19/0092 327/543 |
| 5,892,647 A | * | 4/1999 | Mizoe | G05F 1/573 361/57 |
| 5,910,726 A | * | 6/1999 | Koifman | G05F 3/30 323/907 |
| 7,301,321 B1 | * | 11/2007 | Uang | G05F 3/262 323/907 |
| 7,586,357 B2 | | 9/2009 | Rentala et al. | |
| 10,461,768 B1 | * | 10/2019 | Dong | H03M 1/0881 |
| 11,860,199 B2 | * | 1/2024 | Paolo | G01R 19/0092 |
| 2018/0136685 A1 | * | 5/2018 | Yun | H02M 3/1588 |

* cited by examiner

*Primary Examiner* — Steven L Yeninas
(74) *Attorney, Agent, or Firm* — Mandy Barsilai Fernandez; Frank D. Cimino

(57) ABSTRACT

An example circuit includes a transistor including a first current terminal, a second current terminal, and a control terminal, the first current terminal of the transistor coupled to a load terminal, the second current terminal of the transistor coupled to a ground; a sense transistor including a first current terminal, a second current terminal, and a control terminal, the second current terminal of the sense transistor coupled to the ground; an amplifier including a first input, a second input, and an output terminal, the second input of the amplifier coupled to the output terminal of the amplifier; and a resistor including a first terminal and a second terminal, the first terminal of the resistor coupled to the output terminal of the amplifier and the control terminal of the transistor, and the second terminal coupled to the control terminal of the sense transistor.

20 Claims, 6 Drawing Sheets

METHODS AND APPARATUS TO IMPROVE ACCURACY OF CURRENT SENSE CIRCUITRY

FIELD OF THE DISCLOSURE

This disclosure relates generally to circuits, and, more particularly, to methods and apparatus to improve accuracy of current sense circuitry.

BACKGROUND

Current sense circuitry is used to determine an amount of current drawn by a load. Current sense circuitry is structured to output a current sense output that is proportional to the load current. The sensed current can be used to control other circuitry.

SUMMARY

In accordance with at least one example of the disclosure, a circuit includes a transistor including a first current terminal, a second current terminal, and a control terminal, the first current terminal of the transistor coupled to a load terminal, the second current terminal of the transistor coupled to a ground; a sense transistor including a first current terminal, a second current terminal, and a control terminal, the second current terminal of the sense transistor coupled to the ground; an amplifier including a first input, a second input, and an output terminal, the second input of the amplifier coupled to the output terminal of the amplifier; and a resistor including a first terminal and a second terminal, the first terminal of the resistor coupled to the output terminal of the amplifier and the control terminal of the transistor, and the second terminal coupled to the control terminal of the sense transistor.

DETAILED DESCRIPTION

Figure 1:
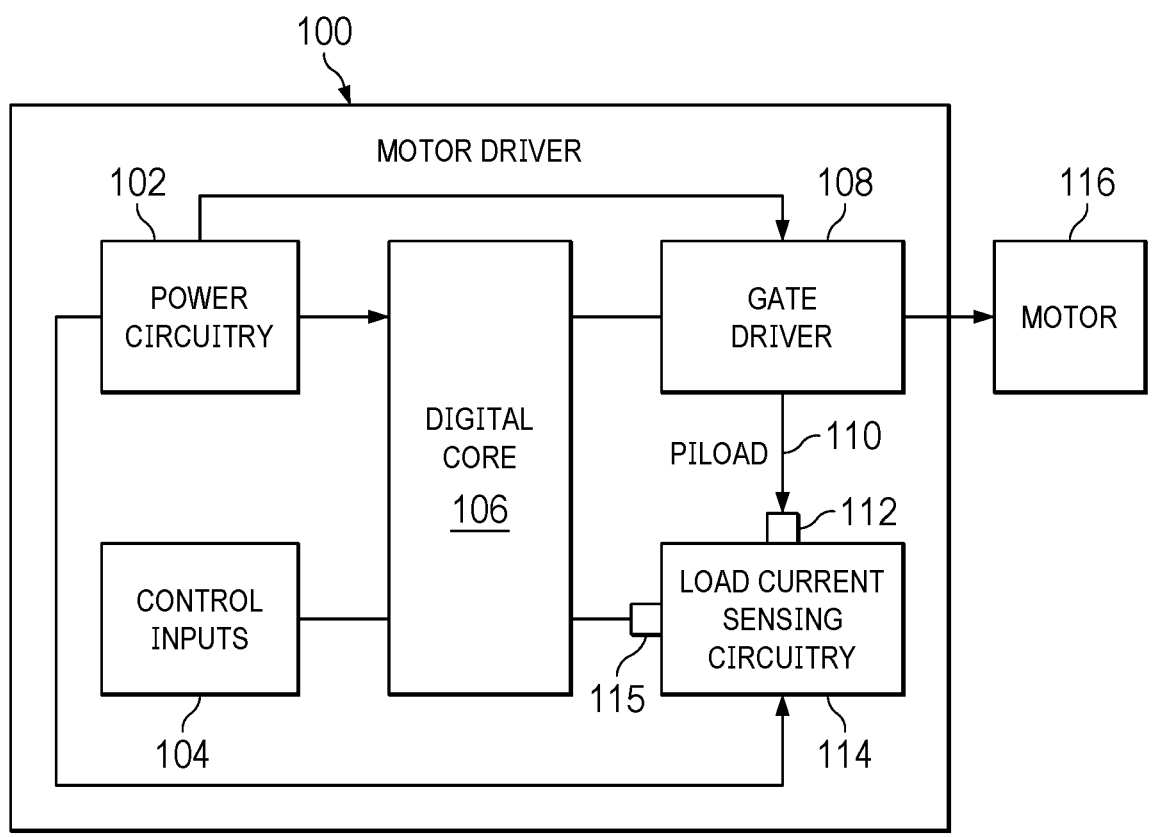
FIG. 1 is an example system for implementing load current sensing circuitry in conjunction with examples disclosed herein.

Current sense circuits utilize transistors and/or amplifiers to sense an amount of current drawn by a load. For example, a current sense circuit may sample a load current and generate an output current that is proportional to the, or a ratio of, load current (e.g., a current copy that corresponds to a current copy ratio of the load current). In this manner, a device or user can obtain the proportional load current representative of the load current drawn by a load.

Integrated circuitry (ICs) (e.g., motor drivers) include on board current sense circuits. In this manner, the IC can sense the load current without using an external sense resistor or sense circuitry, thereby reducing the system size, cost, and complexity. In some examples, the sensed current can be used as information by a controller to control power switches to drive a motor. For example, motor drivers can utilize sense current measurements to limit the load current in the event of motor stall or high torque events. In some examples, the current sense can be provided to a different component (e.g., a user interface to display the amount of load current).

Some current sense circuits include transistors (e.g., a low side transistor, a sense transistor, etc.) and/or an amplifier to sense the load current. Such current sense circuits can be accurate for particular ranges of load currents. However, signal levels from sense circuitry can be low under the low load current (e.g., 50 Milliamperes (mA) or lower). Low signal levels cause the accuracy of the current sense circuit to become dependent on an offset of the amplifier in the current sense circuitry.

Some current sense circuits attempt to increase the accuracy of low signal level current sensing by adding a large number of trim bits in an amplifier or by adding complex offset cancellation schemes. However, such solutions added to current sense circuits increase the overall silicon area of the IC, increase the time to sense the load current, increase the final test time (e.g., due to the need to perform trimming in production), increase cost, and increase complexity.

Examples disclosed herein improve current sense accuracy at low load currents. Examples disclosed herein reduce the dependency of the current sense circuit on amplifier offset at low load currents by reducing the gate-to-source voltage (VGS) of field effect transistors (FETs) in a current sense circuit. Reducing VGS causes higher drain-to-source resistance (RDSON) of the FETs. Higher drain-to-source resistance results in higher signal levels at lower load currents, thereby reducing the impact of amplifier offset. Examples disclosed herein control the VGS of the FETs by providing a proportional current (e.g., the load current times 1/N, through a diode-connected device (e.g., a FET configured to operate like a diode). The value of the provided current and the size of the diode-connected device is selected based on a desired signal level calculated for a certain error percentage.

However, in some examples, switching to a lower VGS may not result in proportionate scaling of resistance of the FETs in a current sense due to different characteristics (e.g., channel width and/or length) of the FETs. Accordingly, lowering the VGS may result in a current copy ratio being adjusted. The current copy ratio is a value (1/N) that corresponds to the proportion of the load current that the current sense circuitry senses and outputs as a value. As a result, the current sense circuitry outputs the value proportional to the load current based on the current copy ratio. A user or device can use the output value to determine the load current based on the current copy ratio. However, if the current copy ratio is adjusted when VGS is lowered, it is difficult to determine what the load current is. For example, if the current copy ratio is 1/5 and the current sense outputs a value of 1, a user and/or device can determine that the load current is 5 Amps by multiplying the value of 1 by the reciprocal of the current copy ration (e.g., 1*5). However, if the current copy ratio is adjusted (e.g., to 1/4), the user and/or device will not know that the current copy ratio has adjusted or by how much. If the output value is 1 and the current copy ratio adjusted from 1/5 to 1/4, the user and/or device may determine that the load current is still 5 Amps, even though the load current is actually 4 Amps (e.g., the value of 1 times the reciprocal of ¼).

Additionally, reducing VGS may result in the overall current copying becoming a function of temperature. As a result, the current sensing may suffer from temperature drift that will lead to current sense accuracy reduction. Additionally, lowering the VGS makes the resistance of the FETS more susceptible to mismatches between the power FET and the sense FET, which may cause gain errors.

Examples disclosed herein provide a circuit that compensates for the differences in VGS between the power and sense FETs to create a substantially constant current copying ratio across varying loads and temperatures. Additionally, examples disclosed herein trim (e.g., reduce) the mismatch between the characteristics of the power and sense FETs to achieve better accuracy at lower VGS voltages without requiring separate gain trim circuitry. Examples disclosed herein achieve higher accuracy than prior approaches when sensing low load currents. Additionally, because examples disclosed herein result in higher signal levels at lower load currents, the number of trim bits for offset trimming can be reduced.

FIG. 1 illustrates an example motor driver 100 in which a load current sensing circuitry 114 may be implemented. The motor driver 100 of FIG. 1 includes power circuitry 102, control inputs 104, a digital core 106, gate driver 108, a proportional load current 110, interfaces/pins 112, 115 and load current sensing circuitry 114. The motor driver 100 drives the motor 116. Although the load current sensing circuitry 114 is implemented in the motor driver 100 of FIG. 1, the load current sensing circuitry 114 may be implemented by itself (e.g., in a dedicated IC) or in any IC where sensing of a load current is desired. Also, while shown as part of a motor driver, the load current sending circuitry 114 can be used in other applications.

The motor driver 100 can be an IC that is used to drive the motor 116. The power circuitry 102 provides voltage and/or current that is used to power the digital core 106, gate driver 108, and/or load current sensing circuitry 114 to drive the motor 116. In some examples, the power circuitry 102 may include a charge pump, a voltage regulator, and/or other circuitry to regulate and/or generate voltage and/or current. The control inputs 104 represent one or more interfaces that obtain control instructions (e.g., one or more signals) from one or more external devices. The control inputs 104 control how the motor 116 is driven. The digital core 106 has logic to control the gate driver 108 to drive the motor 116 based on the instructions obtained via the control inputs 104. The gate driver 108 drives the motor 116 using the voltage and/or current from the power circuitry 102 based on instructions from the digital core 106.

The proportional load current 110 of FIG. 1 is proportional to the load current drawn by the motor 116. In some examples, the proportion of the current being drawn by the motor and the proportional load current 110 is one-to-one (e.g., the load current is equal to the proportional load current 110). The load current sensing circuitry 114 of FIG. 1 obtains the proportional load current from the gate drivers 108 via the load current interface/pin 112. The interface 112 may be a pin, bond pad, etc. with a wire, etch, etc. that connects to an output terminal of the gate driver 108. The load current sensing circuitry 114 obtains the proportional load current 110 to generate an output value corresponding to the load current being drawn by the motor 116. As further described below, the load current sensing circuitry 114 determines a value corresponding to the load current accurately whether load current being drawing by the motor 116 is high or low. In some examples, the load current sensing circuitry 114 outputs a current or value proportional to the load current to the digital core 106 via the current proportional pin/interface 115. In this manner, the digital core 106 can control (e.g., adjust operation) of the gate driver 108 based on the output current and/or value. The load current sensing circuitry 114 is further described below in conjunction with FIG. 2.

Figure 2:
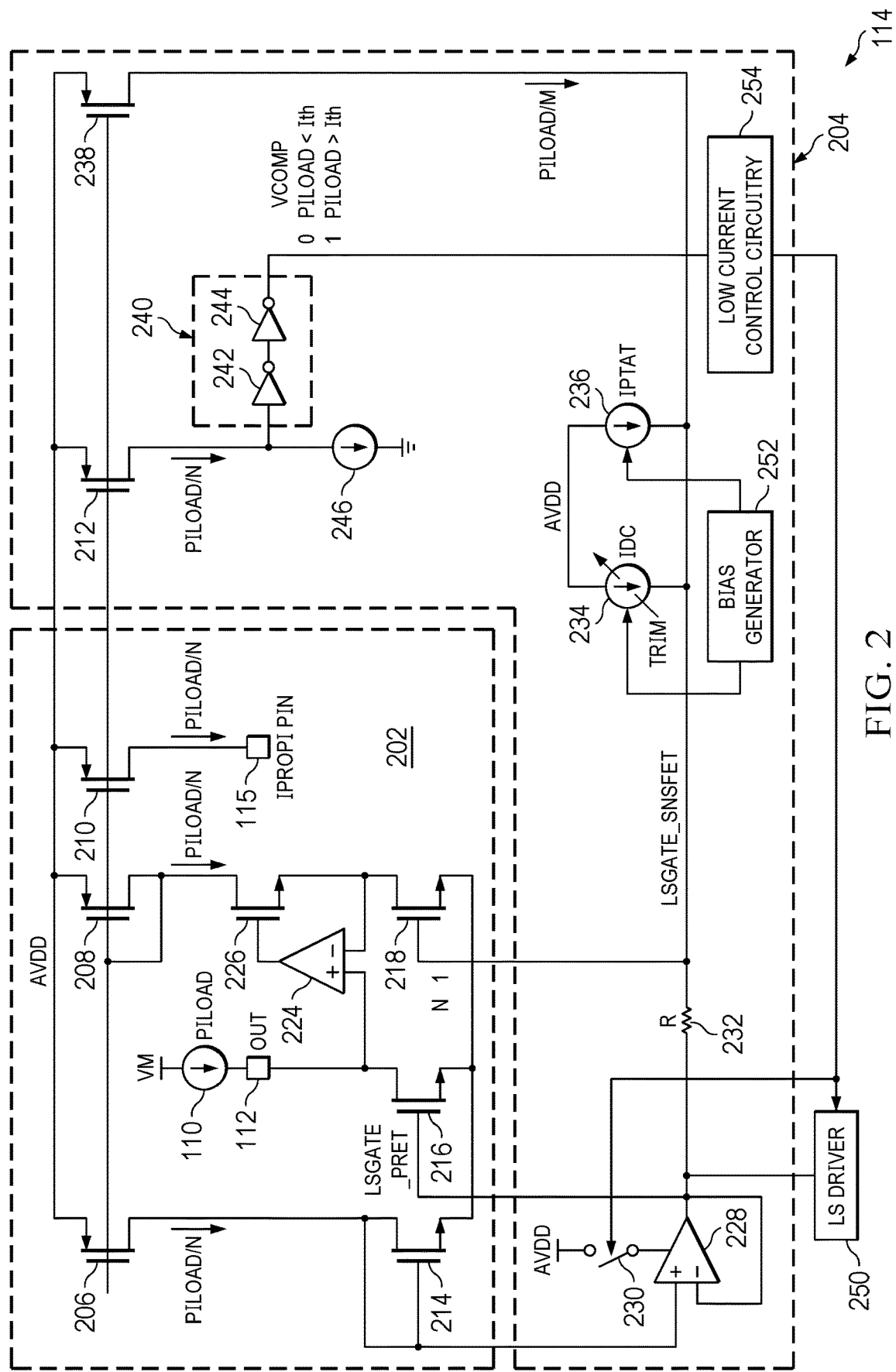
FIG. 2 is an example implementation of a circuit to implement the load current sensing circuitry of FIG. 1.

FIG. 2 is an example circuit diagram of the load current sensing circuitry 114 shown in FIG. 1. Also shown in FIG. 2 are the proportional load current 110 and the interfaces/pins 112, 115 of FIG. 1. The load current sensing circuitry 114 includes current sense circuitry 202, a low current compensation circuit 204, and a low side driver 250. The current sense circuitry 202 includes transistors 206, 208, 210, 214, 216, 218, 226 and an amplifier 224. The low current compensation circuitry 204 includes transistors 212, 238, an amplifier 228, a switch 230, a resistor 232, current sources 234, 236, 246 (also referred to as current source circuitry), example comparator circuitry 240 (which includes logic gates 242, 244), a bias generator 252, and low current control circuitry 254. The load current sensing circuitry 114 further includes a low side (LS) driver 250.

In the example of FIG. 2 the transistors 206, 208, 210, 212, 238 are P-channel metal oxide semiconductor (MOS) FETs (P-channel MOSFETs or PMOSs) and the transistors 214, 216, 218, 226 are N-channel MOSFETs (NMOSs). However, the transistors 206, 208, 210, 212, 214, 216, 218 238 may be implemented by different types of transistors. The transistors 206, 208, 210, 212, 214, 216, 218 238 each include a first current terminal (e.g., a source terminal), a second current terminal (e.g., a drain terminal) and a control terminal (e.g., a gate terminal). The first current terminal of the transistor 206 is coupled to a supply voltage node (e.g., AVDD). The second current terminal of the transistor 206 is coupled to a current terminal of the transistor 214. The gate terminal of the transistor 206 is coupled to the gate terminals of the transistors 208, 210, 212, 238 and the second current terminal of the transistor 208. The gate terminals of the transistors 206, 208, 210, 212, and 238 are coupled to the second current terminal of the transistor 208. As a result, a voltage at the second current terminal of the transistor 208 is used to drive the gates of the transistors 206, 208, 210, 212, 238, as further described below.

The first current terminal of the transistor 208 is coupled to the supply voltage node (e.g., AVDD). The second current terminal of the transistor 208 is coupled to a first current terminal of the transistor 226 and the gate terminals of the transistors 206, 208, 210, 212, 238. The gate terminal of the transistor 208 is coupled to the gate terminals of the transistors 206, 210, 212, 238 and the first current terminal of the transistor 226.

The first current terminal of the transistor 210 is coupled to the supply voltage node (e.g., AVDD). The second current terminal of the transistor 210 is coupled to the proportional current (IPROPI) pin 115. The gate terminal of the transistor 210 is coupled to the gate terminals of the transistors 206, 208, 212, 238 and the first current terminal of the transistor 226.

The first current terminal of the transistor 212 is coupled to the supply voltage node (e.g., AVDD). The second current terminal of the transistor 212 is coupled to the comparator 240 and the current source 246. The gate terminal of the transistor 212 is coupled to the gate terminals of the transistors 206, 208, 210, 238 and the first current terminal of the transistor 226.

The first current terminal of the transistor 214 is coupled to the second current terminal of the transistor 206, the gate terminal of the transistor 214, and a first input terminal of the amplifier 228. The second current terminal of the transistor 214 is coupled to a ground terminal. The gate terminal of the transistor 214 is coupled to the first current terminal of the transistor 214, the second current terminal of the transistor 206, and the first input terminal of the amplifier 228.

The first current terminal of the transistor 216 is coupled to the interface/pin 112 of FIG. 1 and a first input terminal of the amplifier 224. The second current terminal of the transistor 216 is coupled to the ground. The gate terminal of the transistor 216 is coupled to a second input terminal of the amplifier 228, the output terminal of the amplifier 228, the resistor 232, and the LS driver 250 (also referred to as LS driver circuitry).

The first current terminal of the transistor 218 is coupled to a second input terminal of the amplifier 224 and a second current terminal of the transistor 226. The second current terminal of the transistor 218 is coupled to the ground. The gate terminal of the transistor 218 is coupled to the resistor 232 and the current sources 234, 236, and the second current terminal of the transistor 238.

The first current terminal of the transistor 226 is coupled to the second current terminal of the transistor 208 and the gate terminal of the transistor 208. The second current terminal of the transistor 226 is coupled to the second input of the amplifier 224 and the first current terminal of the transistor 218. The gate terminal of the transistor 226 is coupled to an output terminal of the amplifier 224. Because the second current terminals of the transistors 214, 216, 218 are all connected to the ground terminal, the second current terminals of the transistors 214, 216, 218 are all coupled to the same node/terminal.

The first current terminal of the transistor 238 is coupled to the to the supply voltage node (e.g., AVDD). The second current terminal of the transistor 238 is coupled to the resistor 232, the current sources 234, 236, and the gate terminal of the transistor 218. The gate terminal of the transistor 212 is coupled to the gate terminals of the transistors 206, 208, 210, 212 and the first current terminal of the transistor 226. The transistor 238 is structured to operate as a current source to provide current (e.g., pIload/M) toward the resistor 232. The pIload/M current is a proportion of the load current that is provided into the resistor 232. As further described below, the transistor 238 can be selected to correspond to the value of M to account for the hyperbolic nature of the relationship between RDSON and VGS of the FETs 216, 218.

The example amplifiers 224, 228 of FIG. 2 each include two input terminals (e.g., a non-inverting (+) input terminal and an inverting (−) input terminal) and one output terminal. Additionally, the amplifier 228 includes an enable terminal or power terminal. The amplifier 224 may also include an enable or power terminal.

The first input terminal of the amplifier 224 is coupled to the interface pin 112 of FIG. 1 and the first current terminal of the transistor 216. The second input terminal of the amplifier 224 is coupled to the second current terminal of the transistor 226 and the first current terminal of the transistor 218. The output terminal is coupled to the gate terminal of the transistor 226.

The first input terminal of the amplifier 228 is coupled to the second current terminal of the transistor 206, the first current terminal of the transistor 214, and a gate terminal of the transistor 214. The second input terminal of the amplifier 228 is coupled to the output terminal of the amplifier 228, the resistor 232, the LS driver 250, and the gate terminal of the transistor 216. The output terminal of the amplifier 228 is coupled to the gate terminal of the FET 216, the second input terminal of the amplifier 228, the resistor 232, and the LS driver 250. The enable/power terminal of the amplifier 228 is coupled to the switch 230.

The switch 230 includes a first terminal, a second terminal and a control terminal. The first terminal of the switch 230 is coupled to the supply voltage node. The second terminal of the switch 230 is coupled to the enable/power terminal of the amplifier 228 and the control terminal is coupled to the low current control circuitry 254.

The resistor 232 includes a first terminal and a second terminal. The first terminal of the resistor 232 is coupled to the output of the amplifier 228, the second input of the amplifier 228, the LS driver 250, and the gate terminal of the transistor 216. The second terminal of the resistor 232 is coupled to the gate terminal of the transistor 218, and the current sources 234, 236, and the transistor 238.

The current sources 234, 236 each includes a first terminal, a second terminal, and a control terminal. The first terminal of the current source 234 is coupled to the supply voltage node. The second terminal of the current source 234 is coupled to the resistor 232, the gate terminal of the transistor 218, and the current source 236, and the second current terminal of the transistor 238. The control terminal of the current source 234 is coupled to the bias generator 252.

The first terminal of the current source 236 is coupled to the supply voltage (e.g., AVDD). The second terminal of the current source 236 is coupled to the resistor 232, the gate terminal of the transistor 218, and the current source 234, and the second current terminal of the transistor 238. The control terminal of the current source 236 is coupled to the bias generator 252.

The comparator 240 includes an input terminal and an output terminal. The input terminal of the comparator 240 is coupled to the second current terminal of the transistor 212 and the current source 246. The output terminal of the comparator 240 is coupled to the low current control circuitry 254. As described above, the comparator 240 includes two logic gates 242, 244 (e.g., inverters or not gates). The logic gates 242, 244 each include an input terminal and an output terminal. The input terminal of the logic gate 242 is coupled to the second current terminal of the transistor 212 and the current source 246. The output terminal of the logic gate 242 is coupled to an input terminal of the logic gate 244. The input terminal of the logic gate 244 is coupled to the output terminal of the logic gate 242. The output terminal of the logic gate 244 is coupled to the low current control circuitry 254.

The LS driver 250 of FIG. 2 includes two terminals. The first terminal of the LS driver 250 is coupled to the second input terminal of the amplifier 228, the output terminal of the amplifier 228, the resistor 232, and gate terminal of the transistor 216. The second terminal of the LS driver 250 is coupled to the low current control circuitry 254.

The bias generator 252 includes two terminals. The first terminal of the bias generator 252 is coupled to the control terminal of the current source 234. The second terminal of the bias generator 252 is coupled to the control terminal of the current source 236.

The low current control circuitry 254 includes three terminals. The first terminal of the low current control circuitry 254 is coupled to the output terminal of the comparator 240/logic gate 244. The second terminal of the low current control circuitry 254 is coupled to the LS driver 250. The third terminal of the low current control circuitry 254 is coupled to the control terminal of the switch 230.

When the load current is drawn from the motor 116 of FIG. 1, the proportional load current 110 is accessed via the interface/pin 112. The proportional load current 110 flows toward the first current terminal of the transistor 216 (e.g., also referred to as power FET 216) which results in a drain-to-source voltage across the power FET 216 that is amplified by the amplifier 224 to turn on the transistor 226. In this manner, the current flowing toward the first current terminal of the enabled transistor 226 corresponds to the load current divided by N (e.g., pIload/N also referred to as a current copy ratio). The value of N corresponds to a ratio between the sizes of the power FET 216 and the transistor 218 (e.g., also referred to as a sense FET 218). The gate terminals of the transistors 206, 208, 210, 212 are coupled together and the gate terminal of the transistor 208 is coupled to the second current terminal of the transistor 208. As a result, the transistors 206, 208, 210, 212 are structured as a current mirror to mirror the current at the second current terminal of the transistor 208 to the second current terminals of the transistors 206, 210, 212. Accordingly, the current corresponding to the current copy ratio (e.g., pIload/N) is mirrored to the first current terminal and gate terminal of the transistor 214, and the second current terminals of one or more of the transistors 206, 210, 212. In this manner, the pIload/N current is output to the IPROPI interface/pin 115, toward the current source 246 and/or comparator 240, toward the resistor 232 and the gate of the transistor 218.

The transistor 214 of FIG. 2 is connected to act as a diode-connected device. The value of the current copy ratio 1/N and the size of the diode device connected device 214 may be selected based on the intended signal level calculated for a certain error percentage. The pIload/N current is input into the transistor 214 and the transistor 214 is coupled to ground. As a result, the voltage at the first current terminal and the gate terminal of the transistor 214 corresponds to the proportional load current 110. For example, as the proportional load current 110 increases, the voltage at the gate terminal of the transistor 214 increases. Accordingly, a voltage corresponding to the proportional load current 110 is input into the first terminal of the amplifier 228. The second input terminal (e.g., the inverting input terminal) of the amplifier 228 is coupled to the output terminal of the amplifier 228. As a result, the amplifier 228 operates as a buffer and/or unity gain amplifier. Accordingly, when the amplifier 228 is enabled, the voltage that corresponds to the proportional load current 110 (e.g., a voltage corresponding to pIload/N) that is at the first input terminal of the amplifier 228 is output at the output terminal of the amplifier 228. As a result, the voltage used to drive the low side FET 216 is based on the proportional load current 110 when the unity gain amplifier 228 is enabled. The voltage at the gate of the low side FET 216 is based on the proportional load current 110. As a result, the gate-to-source voltage of the low side FET 216 is reduced as the proportional load current 110 is reduced. As described above, lowering the VGS on the low side power FET 216 reduces the dependency on the offset of the amplifier 224 at lower currents which can cause higher drain-to-source resistance (RDSON), which can cause higher signal levels at lower load currents.

However, lowering the VGS of the low side power FET 216 may not result in proportionate scaling of resistance of the transistors 216, 218 due to the characteristics of the FETs 216, 218 being different. For example, the low side FET 216 is a power FET with a larger channel width and/or length than the smaller sense FET 218. As a result, lowering the VGS of the power FET 216 based on the load current may result in a deviation of a current copy ratio from an intended value. For example, the 1/N current copy ratio is changed from a known value to an unknown value. The user and/or device that obtains the output proportional load current (pIload/N) relies on the current copy ratio being a constant value to be able to determine the load current. As a result, when the current copy ratio is not constant (e.g., because the ratio has been adjusted), the determination of the load current based on the current copy ratio will be inaccurate. Additionally, lowering the VGS of the low side power FET 216 makes the resistance (e.g., RDSON) of the transistors 216, 218 more susceptible to mismatches between the power FET 216 and the sense FET 218 which can cause gain errors. Accordingly, the example resistor 232 creates a voltage differential that compensates for the differences in VGS between the power FET 216 and sense FET 218 to create a constant current copying ratio (e.g., 1/N) with varying loads. For example, the transistor 238 (e.g., which operates as a current source) provides the pIload/M current toward the resistor 232 that controls the voltage differential between the voltages at the gates of the transistors 216, 218. The pIload/M current is a proportion of the load current that is provided into the resistor 232. The M value corresponds to the characteristics (e.g., channel width and/or length) of the transistor 238). Accordingly, the transistor 238 may be selected to correspond to the value M, which compensates for the difference between the VGS of the power FET 216 and the VGS of sense FET 218 to track a ratio for varying load currents. The difference in the voltage across the terminals of the resistor 232 compensates for the resistance difference caused by the VGS reduction.

As the VGS of the power FET 216 changes with the load current, the relationship between the RDSON and the VGS for the power FET 216 corresponds to a hyperbolic curve. Accordingly, at a lower VGS, a smaller VGS shift is needed to compensate for the RDSON shift than at a higher VGS (e.g., because RDSON is proportional to 1/(VGS-Vth), where Vth is the threshold voltage of the power FET 216). For example, to compensate for X amount of resistance at a lower VGS, only a small adjustment of VGS is needed. However, to compensate for the same X amount of resistance at a higher VGS, you have to adjust the VGS by a higher amount. As a result, the transistor 238 can be selected to correspond to the value of M to account for the hyperbolic nature of the relationship between RDSON and VGS of the FETs 216, 218.

Additionally, reducing VGS of the low side power FET 216 may result in the overall current copying to become a function of temperature. As a result, the current sense ration may suffer from temperature drift which will lead to reduction of accuracy. Accordingly, the example resistor 232 additionally creates a voltage differential that compensates for the differences in VGS between the power FET 216 and sense FET 218 to create a constant current copying ratio (e.g., 1/N) with varying temperature. For example, the current source 236 provides a current (e.g., Iptat) toward the resistor 232 that controls the voltage differential between the voltages at the gates of the transistors 216, 218. The difference in the voltage caused by the resistor 232 (e.g., which corresponds to the difference in VGS of the power FET 216 and the sense FET 218), compensates for the changes in temperature (which can adjust the RDSON). The bias generator 252 controls the current source 236 to output a particular amount of current corresponding to the temperature characteristics.

Additionally, the example current source 234 provides current into the resistor 232 to generate a direct current (DC) shift to trim (e.g., reduce) the mismatch between the power FET 216 and sense FET 218. Trimming the mismatch between the FETS 216, 218 achieves better accuracy at lower VGS values without requiring separate gain trim circuitry. The bias generator 252 controls the current source 234 to output a current (e.g., a direct current) based on the mismatch between the power FET 216 and the sense FET 218.

Accordingly, the unity gain amplifier 228 drives the gate terminal of the low side power FET 216 with a voltage based on proportional load current 110. As a result, when the proportional load current 110 decreases, the voltage at the gate terminal of the low side power FET 216 decreases, which decreases the VGS of the low side power FET 216. Additionally, the resistor 232 and current sources 234, 236, and the transistor 238 (operating as a current source) create a voltage differential between the voltage at the gate of the low side power FET 216 and the gate of the sense FET 218 to compensate for mismatches in the FETs 216, 218 and/or temperature variations. In this manner, the deviation from a constant current copy ratio corresponding to the FETs 216, 218 will be reduced.

However, although the low current compensation circuitry 254 of FIG. 2 increases accuracy for low load currents, using a voltage based on the proportional load current 110 when the proportional load current 110 is high (e.g., above 2 A or 2.5 A) will result in high power dissipation. Accordingly, the comparator 240 and the current source 246 are structured to identify when the load current or a proportional load current (e.g., pIload 110 and/or pIload/N) is above a threshold current (e.g., 2 A or 2.5 A) to turn off the unity gain amplifier 228. In this manner, when the proportional load current is above the threshold, the unity gain amplifier 228 will not drive the gate terminal of the transistor 216 with a voltage based on the load current and/or the proportional load current 110. Rather, the LS driver 250 is enabled to drive the gate of the low side power FET 216 with a constant voltage. To determine when the proportional current is above a threshold, the current source 246 is set at a current such that when the pIload/N current is above a user defined threshold, the current and/or voltage at the input of the comparator 240 will be above a threshold voltage of the comparator 240 (e.g., the inverters 242, 244), thereby resulting in the comparator 240 outputting a logic '1' or high voltage. When the pIload N current is below a user defined threshold, the current and/or voltage at the input of the comparator 240 will be below a threshold voltage of the comparator 240, thereby resulting in the comparator 240 outputting a logic '0' or low voltage. In the example of FIG. 2 the comparator 240 is implemented by two inverters or NOT logic gates 242, 244. However, the comparator 240 may be implemented by a buffer, an amplifier, a comparator, transistors, and/or any other circuitry that can compare a voltage and/or current to a threshold.

The output value of the comparator circuitry 240 of FIG. 2 is transmitted to the low current control circuitry 254. The low current control circuitry 254 determines whether the load is above or below the threshold based on the output of the comparator 240. Based on the determination, the low current control circuitry 254 transmits one or more signals to the example switch 230 and/or the example LS driver 250 to (a) enable the unity gain amplifier 228 (e.g., by closing the switch 230) and (b) disabling the LS driver 250 when the current is below the threshold. Additionally, the low current control circuitry 254 transmits one or more signals to the example switch 230 and/or the example LS driver 250 to (b) disable the unity gain amplifier 228 (e.g., by opening the switch 230) and (b) enabling the LS driver 250 when the current is above the threshold. In some examples the switch 230 is implemented by a MOSFET. In some examples, the output of the comparator is fed directly into the control terminal of the switch 230 and/or the LS driver 250 to enable/disable the unity gain amplifier 228/LS driver 250 based on the output of the comparator 240. In this manner, when the current is low (e.g., below a threshold), the unity gain amplifier 228 drives the gate terminal of the low side power FET 216 with a voltage corresponding to the load current and/or proportional load current 110 and when the current is high (e.g., below the threshold), the LS driver 250 drives the gate terminal of the low side power FET 216.

Figure 3:
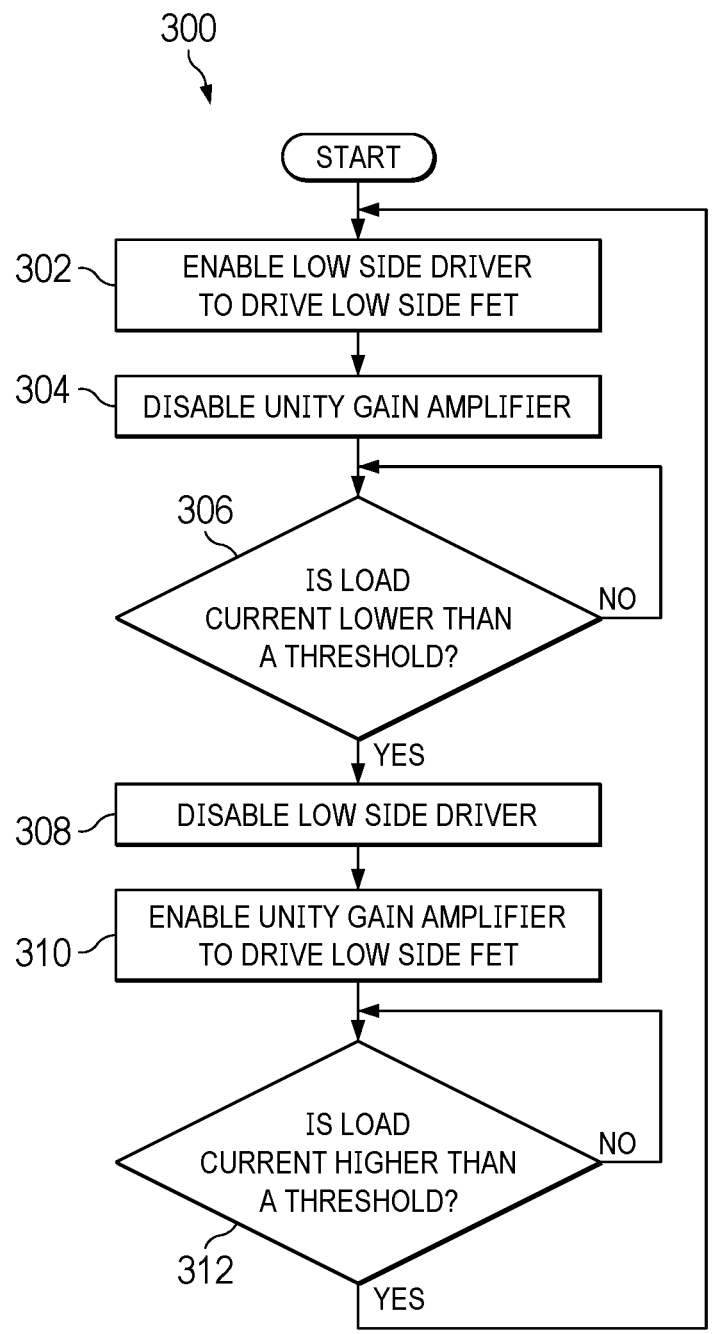
FIG. 3 is a flowchart representative of machine-readable instructions that may be executed to implement the load current sensing circuitry of FIG. 2.

FIG. 3 is a flowchart representative of example machine-readable instructions and/or example operations 300 that may be executed and/or instantiated by processor circuitry or any other circuitry to improve accuracy of current sense circuitry. Although the instructions of FIG. 3 are described in conjunction with the load current sensing circuitry 114 of FIGS. 1-2 in the motor driver 100 of FIG. 1, the instructions may be described in conjunction with any type of load current sensing circuitry in any type of system and/or implemented as a standalone circuit. The machine-readable instructions and/or the operations 300 of FIG. 3 begin at block 302, at which the low current control circuitry 254 enables the LS driver 250 to drive the low side power FET 216. For example, the low current control circuitry 254 and/or the comparator circuitry 240 outputs a signal to the example LS driver 250 to trigger the LS driver 250 to drive the gate terminal of LS power FET 216 by outputting one or more voltages.

At block 304, the example low current control circuitry 254 disables the unity gain amplifier 228. For example, the low current control circuitry 254 (and/or the output of the comparator circuitry 240) outputs a signal to the example switch 230 to open the switch 230, thereby removing a connection to a voltage source to power and/or enable the unity gain amplifier 228. In this manner, the low side power FET 216 is controlled by the LS driver 250 which outputs a user and/or manufacturer selected voltage (e.g., 3.3 V or 5 V). At block 306, the example comparator circuitry 240 determines if a proportional load current (e.g., pIload/N) is lower than a threshold. As described above, the current source 246 is structured to generate a current such that when the proportional load current is above a threshold, the comparator 240 will output a value that can be used to identify that the proportional load current is above the threshold. A user and/or manufacturer can select the amount of current generated by the current source 246 to correspond to the threshold to trigger a switch in control (e.g., to/from LS driver control from/to unity gain control).

If the example comparator circuitry 240 determines that the proportional load current is not lower than the threshold, control returns to block 306 to continue LS driver control until the proportional load current decreases below the proportional load current threshold. If the example comparator circuitry 240 determines that the proportional load current is lower than the threshold, control continues to block 308 and block 310 to switch from LS driver control to unity gain amplifier control to increase the accuracy of current sensing for lower load currents. At block 308, the low current control circuitry 254 disables the LS driver 250. For example, the low current control circuitry 254 and/or the comparator circuitry 240 outputs a signal to the example LS driver 250 to trigger the LS driver 250 to stop driving the gate terminal of LS power FET 216.

At block 310, the example low current control circuitry 254 enables the unity gain amplifier 228 to drive the low side power FET 216. For example, the low current control circuitry 254 (and/or the output of the comparator circuitry 240) outputs a signal to the example switch 230 to close the switch 230, thereby connecting a voltage source to power and/or enable the unity gain amplifier 228. In this manner, the low side power FET 216 is controlled by the unity gain amplifier 228 which outputs a voltage that is a function of the load current. At block 312, the example comparator circuitry 240 determines if the proportional load current (pIload/N) is higher than a threshold. If the example comparator circuitry 240 determines that the proportional load current is not higher than the threshold, control returns to block 312 to unity gain amplifier control until the proportional load current increases above the threshold. If the example comparator circuitry 240 determines that the proportional load current is higher than the threshold, control returns to block 302 and block 304 to switch from unity gain amplifier control to LS driver control to avoid high power dissipation associated with a higher VGS.

Figure 4:
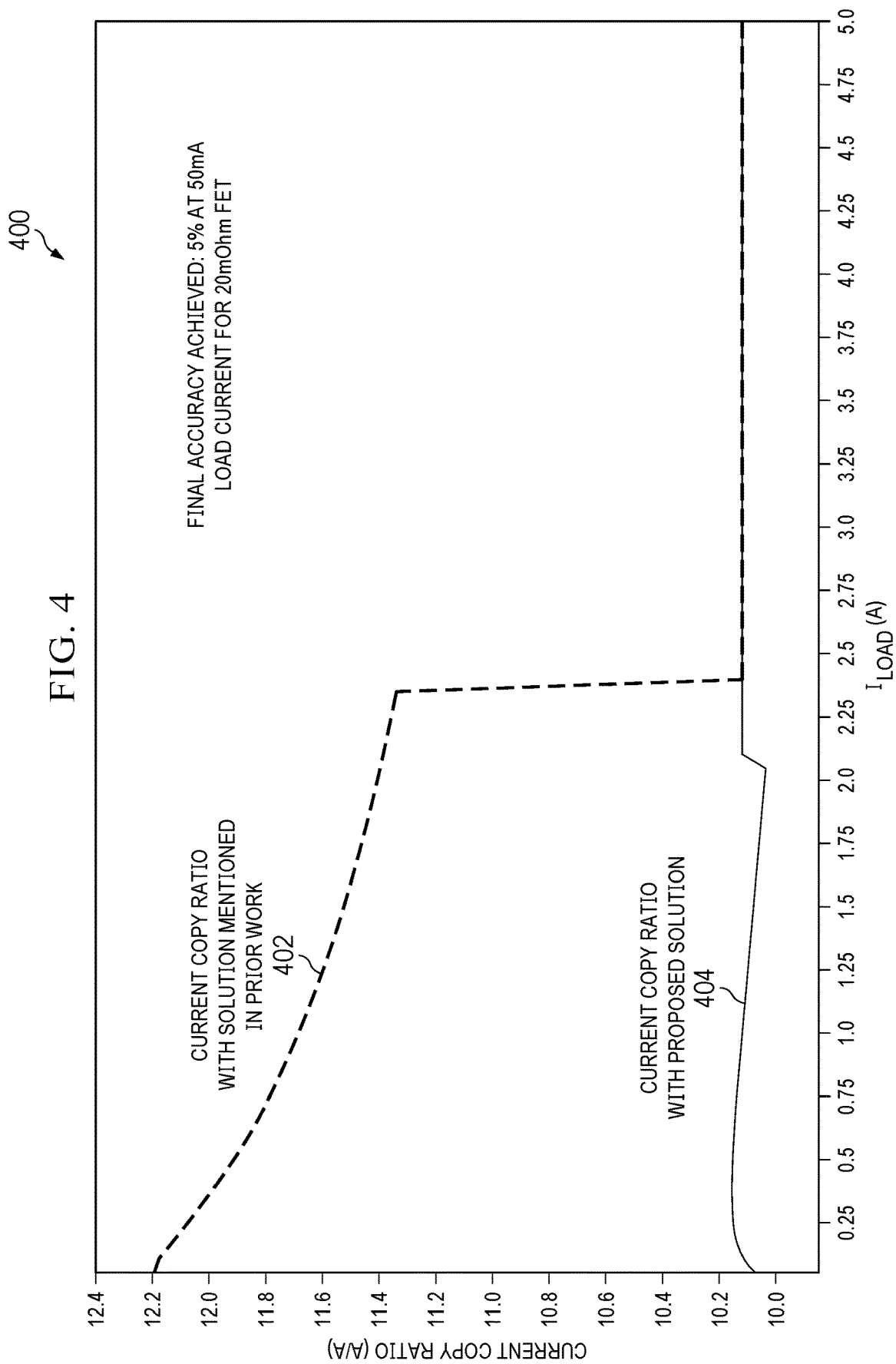
FIG. 4 is an example graph illustrating a current copy ratio with respect to a load current of FIGS. 1 and/or 2.

FIG. 4 illustrates an example graph 400 that includes curves depicting the current copy ratio (1/N) with respect to load current and/or the proportional load current 110. The graph 400 includes a first current copy ratio curve 402 depicting a current copy ratio corresponding to circuitry that does not drive the gate of the low side transistor 216 with a voltage proportional to the load current and a second current copy ratio curve 404 depicting a current copy ratio corresponding to the example load current sensing circuitry 114 of FIGS. 1 and/or 2.

As shown in the example graph 400, the first and second current copy ratio curves 402, 404 are stable (e.g., slope of 0) when the load current is above around 2.4 Amps. However, when the load current is below 2.4 Amps, the first current copy ratio curve 402 is less stable (e.g., the slope varies) than the second current copy ratio curve 404. As described above, if the current copy ratio varies, then the accuracy of the current sense also varies. As a result, examples disclosed herein result in a more accurate current sense at low load currents (e.g., below the threshold current of 2.4 Amps). For example, for a 50 Milliamp load current for a 20 megaohm power FET, the first current copy ratio curve 402 corresponds to around a 20% current sense error and the second current copy ratio curve 404 corresponds to around a 5% current sense error.

Figure 5:
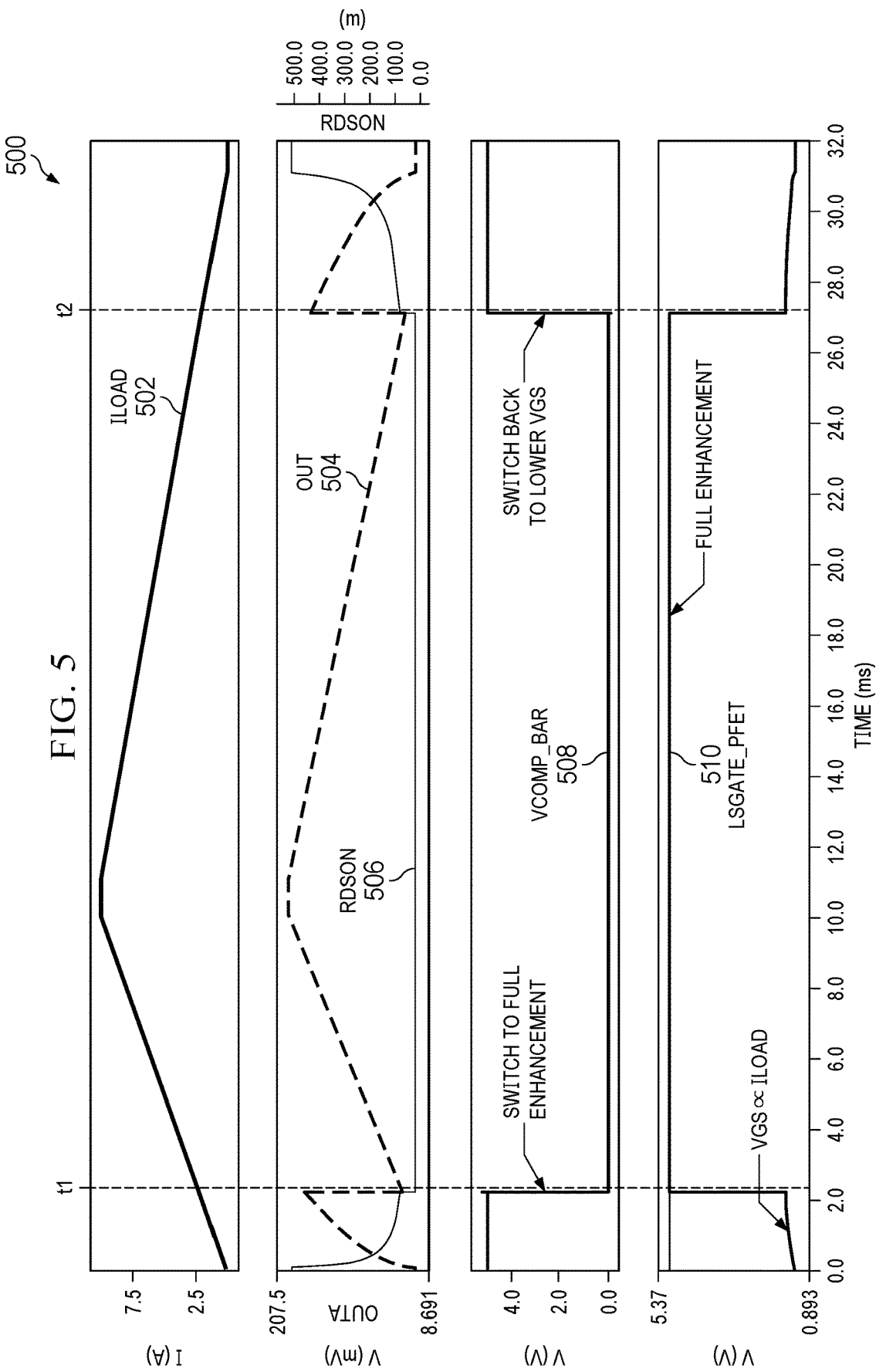
FIG. 5 is an example graph illustrating voltages, currents, and or resistances with respect to the load current of FIGS. 1 and/or 2.

FIG. 5 illustrates example graph 500 that includes curves depicting voltages (e.g., voltages with respect to ground), resistances, and/or currents that can be measured at various nodes of the circuits of FIG. 2 during idle mode. The graph 500 includes a load current curve 502 depicting the proportional load current 110 of FIGS. 1 and/or 2, an output voltage curve 504 depicting the voltage at the first current terminal (e.g., the drain terminal) of the power FET 216, an RDSON curve 506 depicting the RDSON resistance of the low side power FET 216 of FIG. 2, a comparator output curve 508 depicting an output voltage of the comparator circuitry 240, and gate of the low side power FET curve 510 depicting the voltage at the gate of the low side power FET 216 of FIG. 2.

Before time t1, the load current curve 502 is below the threshold voltage (e.g., 2.23 Amps). Accordingly, the unity gain amplifier 228 controls the gate of the low side power FET 216. Additionally, the voltage at the output of the comparator output curve 508 is high (e.g., 5 V) and the voltage at the gate of the of the low wide power FET 216 is proportional to the load current curve 502. As the load current rises while below the threshold, the output voltage curve 504 increases and the RDSON curve 506 decreases. Between times t1 and t2, when the load current curve 502 satisfies the threshold, the voltage at the output of the comparator output curve 508 decreases to 0 V and the output voltage curve 504 tracks the load current curve 502. Accordingly, the unity gain amplifier 228 is disabled and the low side driver 250 is enabled to cause the voltage at the gate of the low side power FET 216 rises to a constant 5 V between time t1 and t2 (e.g., while the load current curve 502 is above the threshold). After time t2, the load current curve 502 drops below the threshold, causing the comparator output curve 508 to increase back to 5 V and the voltage at the gate of the low side power FET curve 510 returns to being proportional to the load current curve 502 and the RDSON curve 506 increases.

Figure 6:
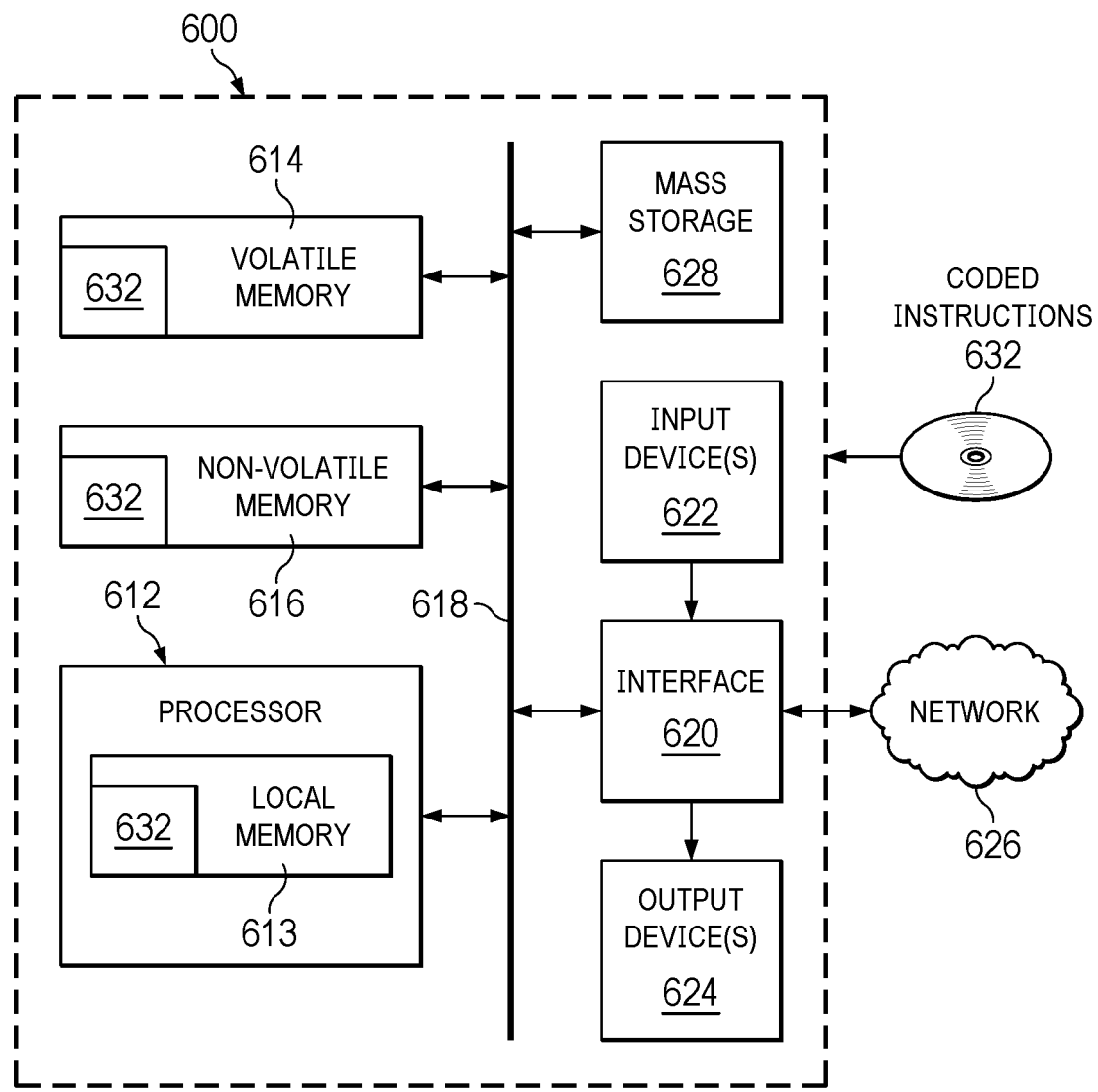
FIG. 6 is a block diagram of an example processing platform structured to execute the instructions of FIG. 3 to implement the load current sensing circuitry of FIG. 2.

FIG. 6 is a block diagram of an example processor platform 600 structured to execute the instructions of FIG. 3 to implement the load current sensing circuitry 114 of FIGS. 1 and/or 2. The processor platform 600 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a gaming console, or any other type of computing device.

The processor platform 600 includes a processor 612. The processor 612 of the illustrated example is hardware. For example, the processor 612 is implemented by one or more integrated circuits, logic circuits, microprocessors, GPUs, DSPs, or controllers from any desired family or manufacturer. The hardware processor may be a semiconductor based (e.g., silicon based) device. The processor 612 may implement the comparator 240, bias generator 252, the LS driver 250, and/or the low current control circuitry 254 of FIG. 2.

The processor 612 includes a local memory 613 (e.g., a cache). The processor 612 of the illustrated example is in communication with a main memory, including a volatile memory 614 and a non-volatile memory 616, via a bus 618. The volatile memory 614 may be implemented by Synchronous Dynamic Random Access Memory (SDRAM), Dynamic Random Access Memory (DRAM), RAMBUS® Dynamic Random Access Memory (RDRAM®) and/or any other type of random access memory device. The non-volatile memory 616 may be implemented by flash memory and/or any other desired type of memory device. Access to the main memory 614, 616 is controlled by a memory controller.

The processor platform 600 also includes an interface circuit 620. The interface circuit 620 may be implemented by any type of interface standard, such as an Ethernet interface, a universal serial bus (USB), a Bluetooth® interface, a near field communication (NFC) interface, and/or a PCI express interface.

In the illustrated example, one or more input devices 622 are connected to the interface circuit 620. The input device(s) 622 permit(s) a user to enter data and/or commands into the processor 612. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 624 are also connected to the interface circuit 620 of the illustrated example. The output devices 624 can be implemented, for example, by display devices (e.g., a light emitting diode (LED), an organic light emitting diode (OLED), a liquid crystal display (LCD), a cathode ray tube display (CRT), an in-place switching (IPS) display, a touchscreen, etc.), a tactile output device, a printer and/or speaker. The interface circuit 620 of the illustrated example, As a result, may include a graphics driver card, a graphics driver chip and/or a graphics driver processor.

The interface circuit 620 also includes a communication device such as a transmitter, a receiver, a transceiver, a modem, a residential gateway, a wireless access point, and/or a network interface to facilitate exchange of data with external machines (e.g., computing devices of any kind) via a network 626. The communication can be via, for example, an Ethernet connection, a digital subscriber line (DSL) connection, a telephone line connection, a coaxial cable system, a satellite system, a line-of-site wireless system, a cellular telephone system, etc.

The processor platform 600 also includes one or more mass storage devices 628 for storing software and/or data. Examples of such mass storage devices 628 include floppy disk drives, hard drive disks, compact disk drives, Blu-ray disk drives, redundant array of independent disks (RAID) systems, and digital versatile disk (DVD) drives.

Machine executable instructions 632, for instance of FIG. 3, may be stored in the mass storage device 628, in the volatile memory 614, in the non-volatile memory 616, and/or on a removable non-transitory computer readable storage medium such as a CD or DVD.

An example manner of implementing the load current sensing circuitry 114 of FIG. 1 is illustrated in FIG. 2. However, one or more of the elements, processes and/or devices illustrated in FIG. 2 may be combined, divided, re-arranged, omitted, eliminated and/or implemented in any other way.

Further, the comparator 240, bias generator 252, the LS driver 250, the low current control circuitry 254, and/or more generally, the load current sensing circuitry 114 of FIG. 2 may be implemented by hardware, software, firmware and/or any combination of hardware, software and/or firmware. As a result, for example, any of the comparator 240, bias generator 252, the LS driver 250, the low current control circuitry 254, and/or more generally, the load current sensing circuitry 114 of FIG. 2 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC (s)), programmable logic device(s) (PLD(s)) and/or field programmable logic device(s) (FPLD(s)).

When reading any of the apparatus or system claims of this patent to cover a purely software and/or firmware implementation, at least one of the comparator 240, bias generator 252, the LS driver 250, the low current control circuitry 254, and/or more generally, the load current sensing circuitry 114 of FIG. 2 is/are hereby expressly defined to include a non-transitory computer readable storage device or storage disk such as a memory, a digital versatile disk (DVD), a compact disk (CD), a Blu-ray disk, etc., including the software and/or firmware. Further still, the modulation circuit 124 and/or the idle mode detector circuit 902 of FIGS. 1-3 and/or 9 may include one or more elements, processes and/or devices in addition to, or instead of, those illustrated in FIGS. 1-3 and/or 9, and/or may include more than one of any or all of the illustrated elements, processes, and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Flowcharts representative of example hardware logic, machine-readable instructions, hardware implemented state machines, and/or any combination thereof for implementing the load current sensing circuitry 114 of FIGS. 1 and/or 2 are shown in FIG. 3 The machine-readable instructions may be one or more executable programs or portion(s) of an executable program for execution by a computer processor such as the processor 612 shown in the processor platform 600 discussed above in connection with FIG. 6. The program may be embodied in software stored on a non-transitory computer readable storage medium such as a CD-ROM, a floppy disk, a hard drive, a DVD, a Blu-ray disk, or a memory associated with the processor 612, but the entire program and/or parts thereof could alternatively be executed by a device other than the processor 612 and/or embodied in firmware or dedicated hardware.

Further, although the example program is described with reference to the flowchart illustrated in FIG. 3, many other methods of implementing the load current sensing circuitry 114 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

The machine-readable instructions described herein may be stored in one or more of a compressed format, an encrypted format, a fragmented format, a compiled format, an executable format, a packaged format, etc. Machine-readable instructions as described herein may be stored as data (e.g., portions of instructions, code, representations of code, etc.) that may be utilized to create, manufacture, and/or produce machine executable instructions. For example, the machine-readable instructions may be fragmented and stored on one or more storage devices and/or computing devices (e.g., servers). The machine-readable instructions may require one or more of installation, modification, adaptation, updating, combining, supplementing, configuring, decryption, decompression, unpacking, distribution, reassignment, compilation, etc. in order to make them directly readable, interpretable, and/or executable by a computing device and/or other machine. For example, the machine-readable instructions may be stored in multiple parts, which are individually compressed, encrypted, and stored on separate computing devices, wherein the parts when decrypted, decompressed, and combined form a set of executable instructions that implement a program such as that described herein.

In another example, the machine-readable instructions may be stored in a state in which they may be read by a computer, but require addition of a library (e.g., a dynamic link library (DLL)), a software development kit (SDK), an application programming interface (API), etc. in order to execute the instructions on a particular computing device or other device. In another example, the machine-readable instructions may need to be configured (e.g., settings stored, data input, network addresses recorded, etc.) before the machine-readable instructions and/or the corresponding program(s) can be executed in whole or in part. As a result, the disclosed machine-readable instructions and/or corresponding program(s) are intended to encompass such machine-readable instructions and/or program(s) regardless of the particular format or state of the machine-readable instructions and/or program(s) when stored or otherwise at rest or in transit.

The machine-readable instructions described herein can be represented by any past, present, or future instruction language, scripting language, programming language, etc. For example, the machine-readable instructions may be represented using any of the following languages: C, C++, Java, C#, Perl, Python, JavaScript, HyperText Markup Language (HTML), Structured Query Language (SQL), Swift, etc.

As mentioned above, the example processes of FIGS. 4, 5 and/or 10 may be implemented using executable instructions (e.g., computer and/or machine-readable instructions) stored on a non-transitory computer and/or machine-readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

From the foregoing, it will be appreciated that example methods, apparatus and articles of manufacture have been disclosed to improve accuracy of current sense circuitry. The disclosed methods, apparatus and articles of manufacture improve the accuracy of current sense circuitry at low currents by driving a power FET of the current sense circuitry with a voltage proportional to the load current.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

Descriptors "first," "second," "third," etc. are used herein when identifying multiple elements or components which may be referred to separately. Unless otherwise specified or understood based on their context of use, such descriptors do not impute any meaning of priority, physical order, or arrangement in a list, or ordering in time but are merely used as labels for referring to multiple elements or components separately for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for ease of referencing multiple elements or components.

In the description and in the claims, the terms "including" and "having" and variants thereof are intended to be inclusive in a manner similar to the term "comprising" unless otherwise noted. Unless otherwise stated, "about," "approximately," or "substantially" preceding a value means+/−10 percent of the stated value. In another example, "about," "approximately," or "substantially" preceding a value means+/−5 percent of the stated value. IN another example, "about," "approximately," or "substantially" preceding a value means+/−1 percent of the stated value.

The term "couple", "coupled", "couples", and variants thereof, as used herein, may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A. Moreover, the terms "couple", "coupled", "couples", or variants thereof, includes an indirect or direct electrical or mechanical connection.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

Although not all separately labeled in the FIGS., components or elements of systems and circuits illustrated therein have one or more conductors or terminus that allow signals into and/or out of the components or elements. The conductors or terminus (or parts thereof) may be referred to herein as pins, pads, terminals (including input terminals, output terminals, reference terminals, and ground terminals, for instance), inputs, outputs, nodes, and interconnects.

As used herein, a "terminal" of a component, device, system, circuit, integrated circuit, or other electronic or semiconductor component, generally refers to a conductor such as a wire, trace, pin, pad, or other connector or interconnect that enables the component, device, system, etc., to electrically and/or mechanically connect to another component, device, system, etc. A terminal may be used, for instance, to receive or provide analog or digital electrical signals (or simply signals) or to electrically connect to a common or ground reference. Accordingly, an input terminal or input is used to receive a signal from another component, device, system, etc. An output terminal or output is used to provide a signal to another component, device, system, etc. Other terminals may be used to connect to a common, ground, or voltage reference, e.g., a reference terminal or ground terminal. A terminal of an IC or a PCB may also be referred to as a pin (a longitudinal conductor) or a pad (a planar conductor). A node refers to a point of connection or interconnection of two or more terminals. An example number of terminals and nodes may be shown. However, depending on a particular circuit or system topology, there may be more or fewer terminals and nodes. However, in some instances, "terminal", "node", "interconnect", "pad", and "pin" may be used interchangeably.

Modifications are possible in the described embodiments, and other embodiments are possible, within the scope of the claims.

What is claimed is:
1. A circuit comprising:
a transistor including a first current terminal, a second current terminal, and a control terminal, the first current terminal of the transistor coupled to a load terminal, the second current terminal of the transistor coupled to a ground;

a sense transistor including a first current terminal, a second current terminal, and a control terminal, the second current terminal of the sense transistor coupled to the ground;

an amplifier including a first input, a second input, and an output terminal, the second input of the amplifier coupled to the output terminal of the amplifier; and a resistor including a first terminal and a second terminal, the first terminal of the resistor coupled to the output terminal of the amplifier and the control terminal of the transistor, and the second terminal coupled to the control terminal of the sense transistor.

2. The circuit of claim 1, further including a third transistor including a first current terminal, a second current terminal, and a control terminal, the first current terminal of the third transistor coupled to a supply voltage and the second current terminal of the third transistor coupled to the second terminal of the resistor and the control terminal of the sense transistor.

3. The circuit of claim 1, further including driver circuitry including an input and an output terminal, the output terminal of the driver circuitry coupled to the output terminal of the amplifier, the first terminal of the resistor, and the control terminal of the transistor.

4. The circuit of claim 3, further including a comparator including an input terminal and an output terminal, the input terminal of the comparator coupled to a third transistor and current source circuitry.

5. The circuit of claim 4, wherein the comparator includes a first inverter coupled to a second inverter.

6. The circuit of claim 4, further including:
a switch including a first terminal and a second terminal, the first terminal of the switch coupled to a supply voltage, the second terminal of the switch coupled to an enable terminal of the amplifier; and
low current control circuitry including an input terminal and an output terminal, the input terminal of the low current control circuitry coupled to the output terminal of the comparator, the output terminal of the low current control circuitry coupled to the switch and the input of the driver circuitry.

7. The circuit of claim 6, wherein the transistor is a first transistor, the switch being a second transistor.

8. The circuit of claim 1, wherein the amplifier is a unity gain amplifier.

9. The circuit of claim 1, further including current source circuitry coupled to the second terminal of the resistor.

10. A method comprising:
responsive to a load current being below a threshold, enabling an amplifier to drive (a) a transistor with a first voltage corresponding to the load current and (b) a sense transistor with a second voltage corresponding to the load current, the second voltage being different than the first voltage; and
responsive to the load current being above the threshold, enabling a driver to drive the transistor with a third constant voltage.

11. The method of claim 10, wherein the first and second voltage corresponds to a voltage differential across a resistor, further including providing a current proportional to the load current into the resistor.

12. The method of claim 10, further including:
determining that the load current is above the threshold or below the threshold;
responsive to the load current being below the threshold, disabling the driver; and
responsive to the load current being above the threshold, disabling the amplifier.

13. The method of claim 10, further including sensing the load current using the transistor and the sense transistor.

14. The method of claim 10, wherein the enabling of the amplifier compensates for a difference between a first resistance of the transistor and a second resistance of the sense transistor.

15. The method of claim 1, wherein the first voltage increases when the load current increases.

16. A circuit comprising:
an amplifier configured to control a transistor with a first voltage responsive to a load current satisfying a threshold, the first voltage corresponding to the load current;
a resistor configured to create a voltage differential across a first terminal and a second terminal of the resistor, the voltage differential corresponding to the first voltage at the first terminal and a second voltage at the second terminal; and
a driver configured to control the transistor with a third voltage responsive to the load current satisfying the threshold, the third voltage different than the first voltage.

17. The circuit of claim 15, further including current source circuitry configured to provide a current proportional to the load current into the resistor.

18. The circuit of claim 15, further including current source circuitry configured to provide a current corresponding to a temperature into the resistor.

19. The circuit of claim 15, further including current source circuitry configured to provide predefined current into the resistor to provide a direct current shift down.

20. The circuit of claim 15, further including a comparator to configured determine whether to the load current satisfies the threshold.

* * * * *